US012690314B2

(12) United States Patent
Lin

(10) Patent No.: US 12,690,314 B2
(45) Date of Patent: Jul. 21, 2026

(54) ELECTRONIC DEVICE AND MANUFACTURE METHOD THEREOF

(71) Applicant: InnoLux Corporation, Miao-Li County (TW)

(72) Inventor: Ming-Chang Lin, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 686 days.

(21) Appl. No.: 18/096,006

(22) Filed: Jan. 11, 2023

(65) Prior Publication Data

US 2023/0261160 A1     Aug. 17, 2023

(30) Foreign Application Priority Data

Feb. 11, 2022    (CN) ......................... 202210128569.0

(51) Int. Cl.
H10H 20/857 (2025.01)
H10H 20/01 (2025.01)
H10H 20/831 (2025.01)

(52) U.S. Cl.
CPC .......... H10H 20/857 (2025.01); H10H 20/01 (2025.01); H10H 20/831 (2025.01); *H10H 20/032* (2025.01); *H10H 20/0364* (2025.01)

(58) Field of Classification Search
CPC .... H10H 20/857; H10H 20/01; H10H 20/831; H10H 20/032; H10H 20/0364; H10H 29/142; H01L 22/32; H01L 125/0753; H01L 25/0753; G01R 31/68
See application file for complete search history.

(56) References Cited

U.S. PATENT DOCUMENTS

| | | | | |
|---|---|---|---|---|
| 12,015,103 | B2 * | 6/2024 | Lo ......................... | H10H 20/812 |
| 2013/0078745 | A1 * | 3/2013 | Wang ................... | H10P 74/273 |
| | | | | 438/15 |
| 2018/0374828 | A1 * | 12/2018 | Liao ...................... | H10W 90/00 |
| 2019/0157340 | A1 * | 5/2019 | Liao ..................... | H10H 29/142 |
| 2019/0393389 | A1 | 12/2019 | Chen | |
| 2020/0411393 | A1 * | 12/2020 | Kim ...................... | H10P 74/273 |
| 2021/0159363 | A1 * | 5/2021 | Xu ......................... | H10D 86/60 |
| 2021/0359155 | A1 * | 11/2021 | Chaji ....................... | G09G 3/32 |
| 2021/0408349 | A1 * | 12/2021 | Cai ........................ | H10H 20/01 |
| 2023/0006117 | A1 * | 1/2023 | Suzuki .................. | H10H 20/01 |
| 2023/0102061 | A1 * | 3/2023 | Watsuda ............... | H10W 20/49 |
| | | | | 257/773 |

FOREIGN PATENT DOCUMENTS

| | | |
|---|---|---|
| CN | 101621057 A | 1/2010 |
| CN | 112992030 A | 6/2021 |
| CN | 113314514 A | 8/2021 |

* cited by examiner

*Primary Examiner* — Victor A Mandala
(74) *Attorney, Agent, or Firm* — Winston Hsu

(57) ABSTRACT

An electronic device can include a first pad, a first detection pad, a second pad and an electronic component. The first detection pad and the first pad can be separated from one another. The electronic component can include a first electrode and a second electrode. The first electrode can be coupled to the first pad and the first detection pad, and the second electrode can be coupled to the second pad.

8 Claims, 10 Drawing Sheets

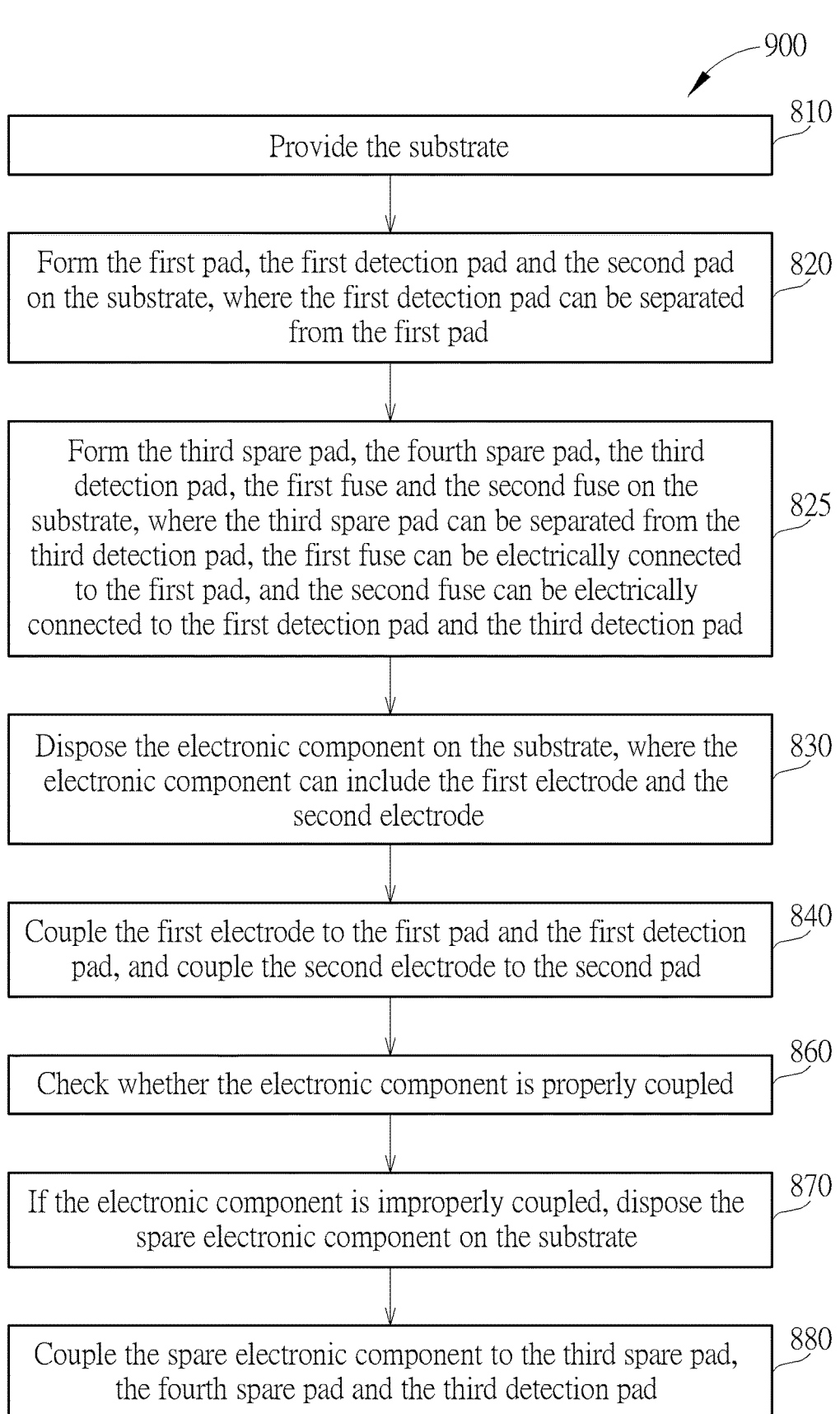

900

810
Provide the substrate

820
Form the first pad, the first detection pad and the second pad on the substrate, where the first detection pad can be separated from the first pad 825
Form the third spare pad, the fourth spare pad, the third detection pad, the first fuse and the second fuse on the substrate, where the third spare pad can be separated from the third detection pad, the first fuse can be electrically connected to the first pad, and the second fuse can be electrically connected to the first detection pad and the third detection pad 830
Dispose the electronic component on the substrate, where the electronic component can include the first electrode and the second electrode 840
Couple the first electrode to the first pad and the first detection pad, and couple the second electrode to the second pad 860
Check whether the electronic component is properly coupled 870
If the electronic component is improperly coupled, dispose the spare electronic component on the substrate 880
Couple the spare electronic component to the third spare pad, the fourth spare pad and the third detection pad

FIG. 9

ELECTRONIC DEVICE AND MANUFACTURE METHOD THEREOF

BACKGROUND OF THE DISCLOSURE

1. Field of the Disclosure

The disclosure is related to an electronic device and the manufacture method thereof, and more particularly, an electronic device and the manufacture method thereof where a detection pad is used to check if an electronic component is properly coupled.

2. Description of the Prior Art

According to current display technology in development, such as microLED technology, a large number of tiny-sized light-emitting diodes (LEDs) should be disposed on a driving substrate. After that, a driving circuit should be turned on for detection. Then, a repairing process can be performed according to the detection results to complete the function of the display.

In the above process, a plurality of light-emitting diodes should be controlled to emit light, a tool and an optical system can be used to detect which diodes fail to emit light, and the repair process can be performed accordingly. In the process, electrical signals should be inputted into the tool, and the optical system is used for receiving the light. Hence, it is difficult to reduce the complexity of the detection system. A better solution is still in need in the field to improve the system and process of the detection.

SUMMARY OF THE DISCLOSURE

An embodiment provides an electronic device including a first pad, a first detection pad, a second pad and an electronic component. The first detection pad can be separated from the first pad. The electronic component can include a first electrode and a second electrode. The first electrode can be coupled to the first pad and the first detection pad, and the second electrode can be coupled to the second pad.

Another embodiment provides a method for manufacturing an electronic device. The method can include providing a substrate; forming a first pad, a first detection pad and a second pad on the substrate, where the first detection pad is separated from the first pad; disposing an electronic component on the substrate, where the electronic component comprises a first electrode and a second electrode; coupling the first electrode to the first pad and the first detection pad; and coupling the second electrode to the second pad.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

FIG. 9 illustrates a method for manufacturing an electronic device according to another embodiment.

DETAILED DESCRIPTION

In order to improve the driving capability of the circuit, FIG. 1 to FIG. 10 are used to illustrate the solutions provided by the embodiments. The architecture, number of components, number of layers, positions, distributions, ratios and so on in FIG. 1 to FIG. 10 are only examples to help explain and understand the embodiments, but not to limit the types and scopes of the embodiments. If the ordinal numbers such as first and second are mentioned in the text, they are only used to distinguish different components, not to limit the order or importance of the manufacturing process.

Throughout the disclosure and the appended claims, certain words are used to refer to specific elements. Those skilled in the art should understand that electronic device manufacturers may refer to the same components by different names. This article does not intend to distinguish those elements with the same function but different names. In the following description and claims, words such as "have" and "include" are open-ended words, so they should be interpreted as meaning "including but not limited to".

It should be understood that when an element or film layer is defined as being "on" or "connected to" another element or film layer, it can be directly on this another element or film layer or directly connected to the another element or layer; or it can be non-directly on this another element or film layer or non-directly connected to the another element or layer with another intervening element or film layer existing between the two element(s)/film layer(s). On the contrary, when an element is defined as being "directly on" or "directly connected to" another element or film layer, there is no intervening element or film layer between the two element(s)/film layer(s).

The term "approximate", "equal", "identical" or "substantially the same" usually means a range within 20% of a given value or range, or means a range within 10%, 5%, 3%, 2%, 1% or 0.5% of a given value or range.

In addition, the term "within the range from the first value to the second value" means that the range includes the first value, the second value, and other values in between.

Although terms such as first, second, third and so on can be used to describe different assembling elements, but these assembling elements are not limited by these terms. These terms are only used to distinguish an assembling element from another assembling element in the specification. In the claims, it is not limited to use the same terms, and the terms such as first, second, and third can be used to indicate the order of defining the elements. Therefore, in the following description, the first assembling element may be corresponding to the second assembling element in the claims.

It should be understood that the technical features of several different embodiments can be replaced, reorganized, and mixed to complete other embodiments without confliction or departing from the spirit of the disclosure.

Figure 1:
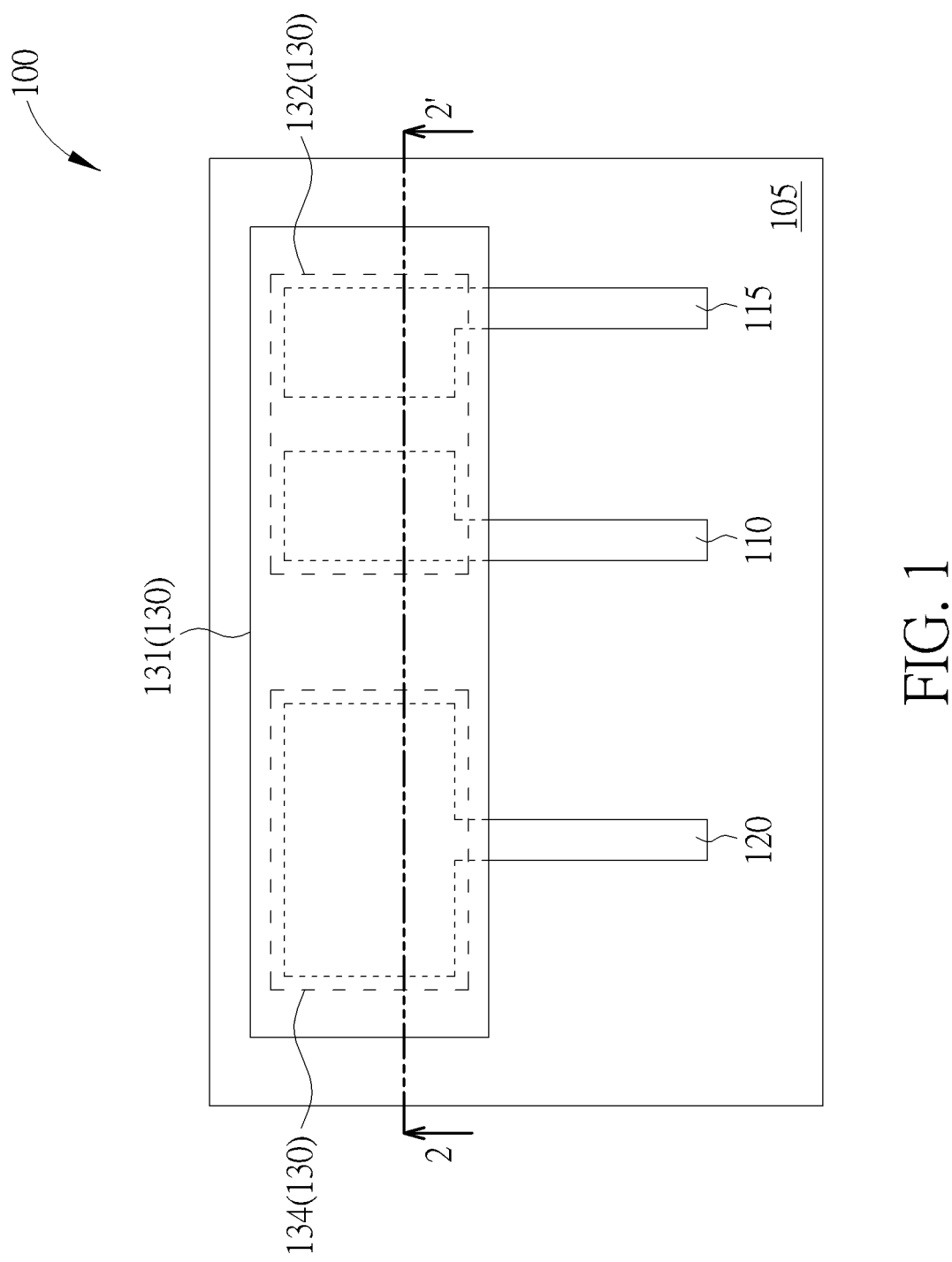
FIG. 1 illustrates a top view of an electronic device according to an embodiment.
Figure 2:
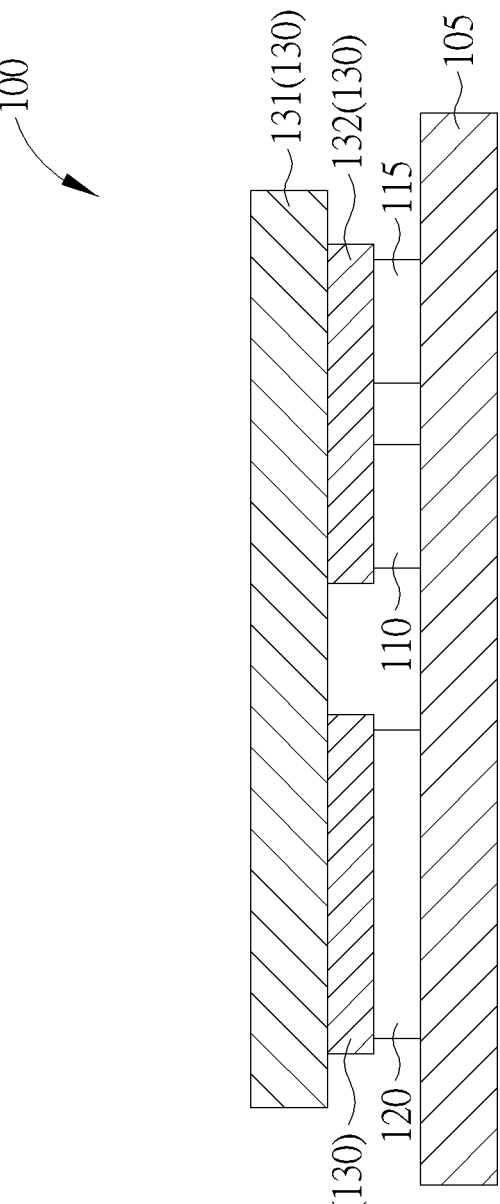
FIG. 2 illustrates a sectional view of the electronic device in FIG. 1.

FIG. 1 illustrates a top view of an electronic device 100 according to an embodiment. FIG. 2 illustrates a sectional view of the electronic device 100 in FIG. 1 along the sectional line 2-2'. As shown in FIG. 1 and FIG. 2, the electronic device 100 can include a first pad 110, a first detection pad 115, a second pad 120 and an electronic component 130. The first detection pad 115 can be separated from the first pad 110. The electronic component 130 can include a light-emitting unit 131, a first electrode 132 and a second electrode 134. The first electrode 132 can be coupled to the first pad 110 and the first detection pad 115, and the second electrode 134 can be coupled to the second pad 120.

As shown in FIG. 1 and FIG. 2, the first pad 110, the first detection pad 115 and the second pad 120 can be on a substrate 105. The electronic component 130 can emit light, perform detection or perform other function(s). For example, the electronic component 130 can include a microLED component, a miniLED component, a laser diode, a photodiode, a capacitor or a transistor, and embodiments are not limited thereto.

According to an embodiment, the electronic component 130 can be coupled to the first pad 110, the first detection pad 115 and the second pad 120. If the electronic component 130 is coupled properly, the first pad 110, the first electrode 132 and the first detection pad 115 can be electrically connected to one another. Hence, the first detection pad 115 can be measured to check if the electronic component 130 is coupled properly.

According to an embodiment, after coupling the electronic component 130 to the first pad 110, the first detection pad 115 and the second pad 120, the first pad 110 can be used to transmit a driving signal for driving the electronic component 130. If the driving signal can be detected at the first detection pad 115, it means that the first pad 110, the first electrode 132 and the first detection pad 115 are electrically connected, and it can be determined that the electronic component 130 is coupled properly.

In another case, after coupling the electronic component 130 to the first pad 110, the first detection pad 115 and the second pad 120, if the driving signal cannot be detected at the first detection pad 115, it means that the first pad 110, the first electrode 132 and the first detection pad 115 are not electrically connected, and it can be determined that the electronic component 130 is not properly coupled.

Figure 3:
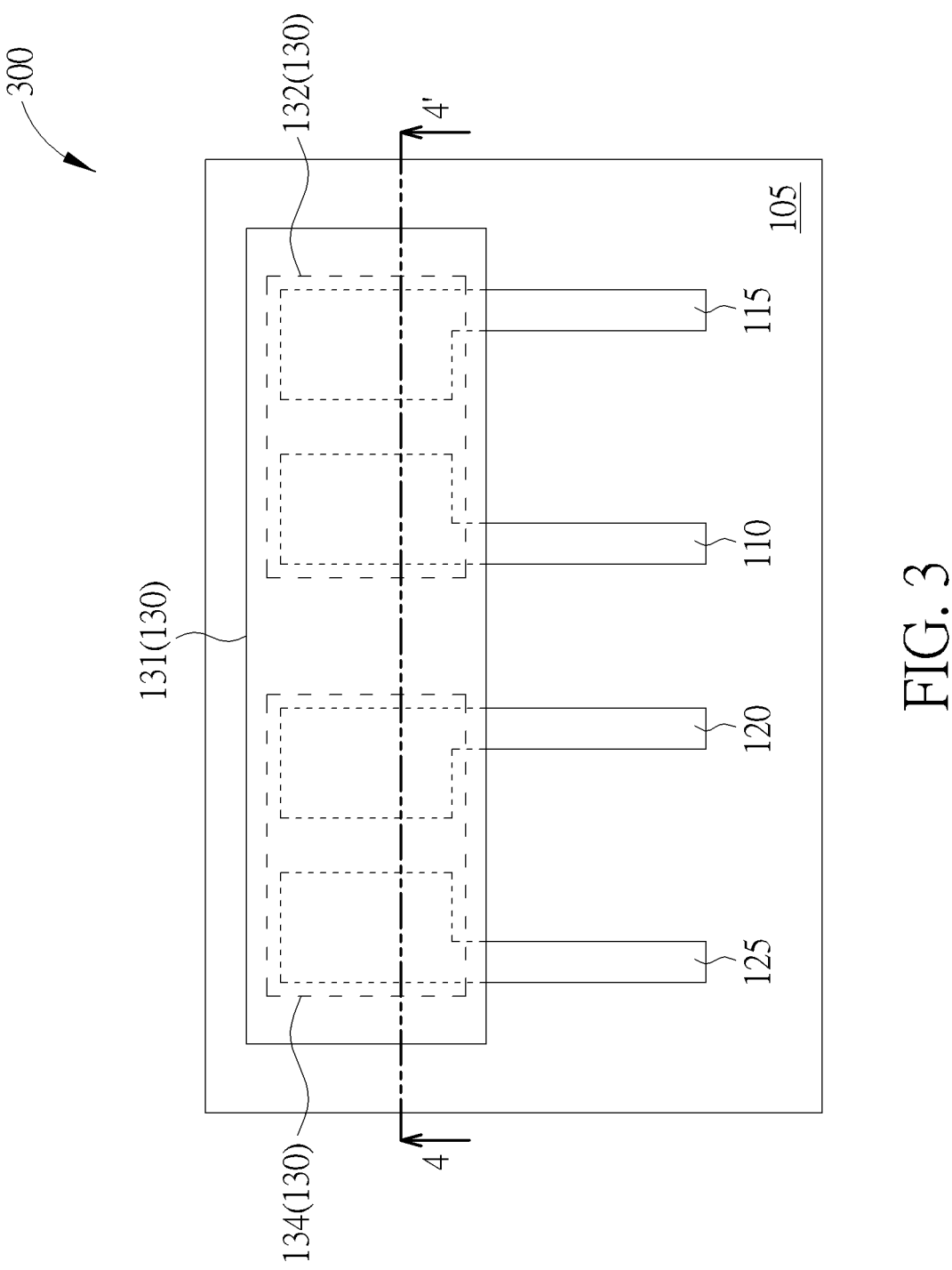
FIG. 3 illustrates a top view of an electronic device according to another embodiment.
Figure 4:
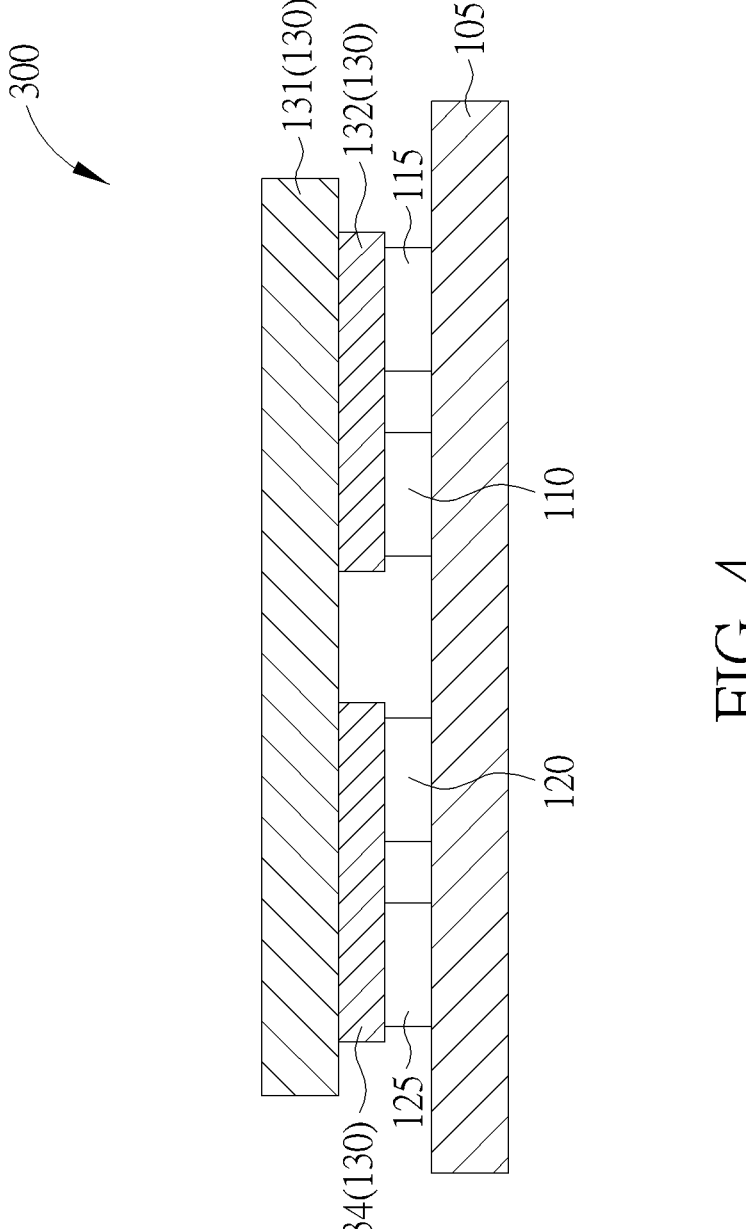
FIG. 4 illustrates a sectional view of the electronic device in FIG. 3.

FIG. 3 illustrates a top view of an electronic device 300 according to an embodiment. FIG. 4 illustrates a sectional view of the electronic device 300 in FIG. 3 along the sectional line 4-4'. Compared with the electronic device 100, the electronic device 300 can further include a second detection pad 125 separated from the second pad 120. The second electrode 134 can be further coupled to the second detection pad 125.

Like the detection process of the electronic device 100, in the electronic device 300, the first detection pad 115 can be used to check if the electronic component 130 is coupled to the first pad 110 properly, and the second detection pad 125 can be used to check if the electronic component 130 is coupled to the second pad 120 properly.

According to an embodiment, after coupling the electronic component 130 to the first pad 110, the first detection pad 115, the second detection pad 125 and the second pad 120, the second pad 120 can be used to transmit a driving signal for driving the electronic component 130. If the driving signal can be detected at the second detection pad 125, it means that the second pad 120, the second electrode 134 and the second detection pad 125 are electrically connected, and it can be determined that the electronic component 130 is coupled properly.

In another case, after coupling the electronic component 130 to the first pad 110, the first detection pad 115, the second detection pad 125 and the second pad 120, if the driving signal cannot be detected at the second detection pad 125, it means that the second pad 120, the second electrode 134 and the second detection pad 125 are not electrically connected, and it can be determined that the electronic component 130 is not properly coupled.

Figure 5:
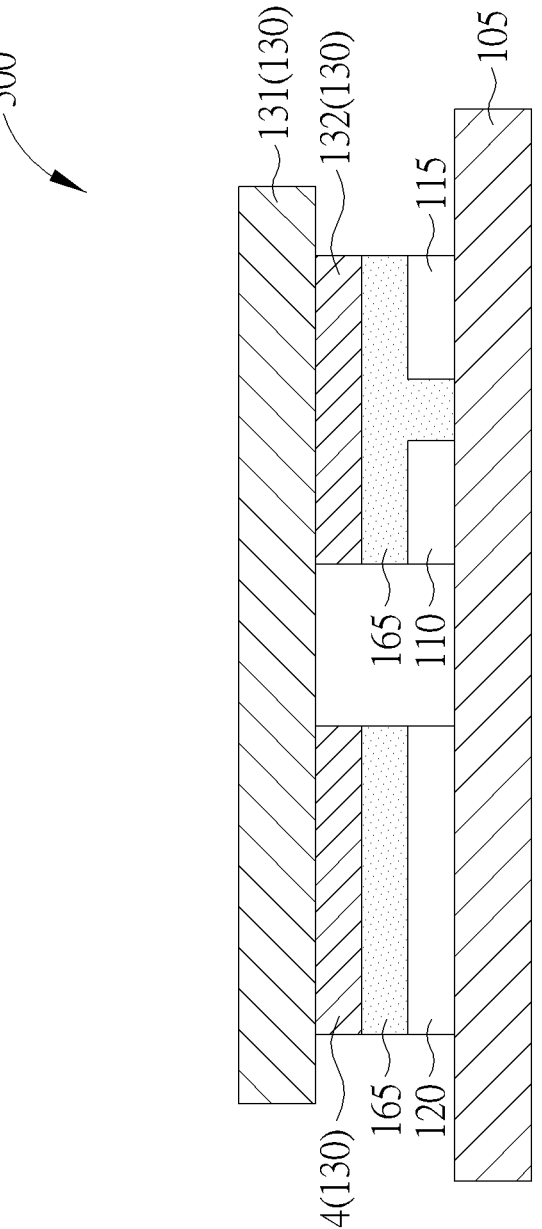
FIG. 5 illustrates a sectional view of an electronic device according to another embodiment.

FIG. 5 illustrates a sectional view of an electronic device 500 according to another embodiment. The electronic device 500 can be similar to the electronic device 100, but the electronic device 500 can further include a conductive material 165. For example, the conductive material 165 can include at least one of a conductive adhesive, a conductive film, a low melting point metal and an alloy. During the manufacturing process, the conductive material 165 can be first placed on the second pad 120 and at least one of the first pad 110 and the first detection pad 115. When the electronic component 130 is coupled, the conductive material 165 can be softened and deformed due to at least one of the pressure and temperature. Hence, the conductive material 165 can be filled among the first pad 110, the first electrode 132 and the first detection pad 115, and the conductive material 165 can be filled between the second pad 120 and the second electrode 134. As a result, a suitable conductive structure is formed.

According to an embodiment, among the first pad 110, the first electrode 132 and the first detection pad 115, and between the second pad 120 and the second electrode 132, the boundaries of layers may not be as clear as shown in FIGS. For example, if the conductive material 165, the electrode(s) and pad(s) are melted and mixed with one another, an intermetallic compound (IMC) may be generated without clear boundaries of layers, and this is also within the scope of embodiments.

Figure 6:
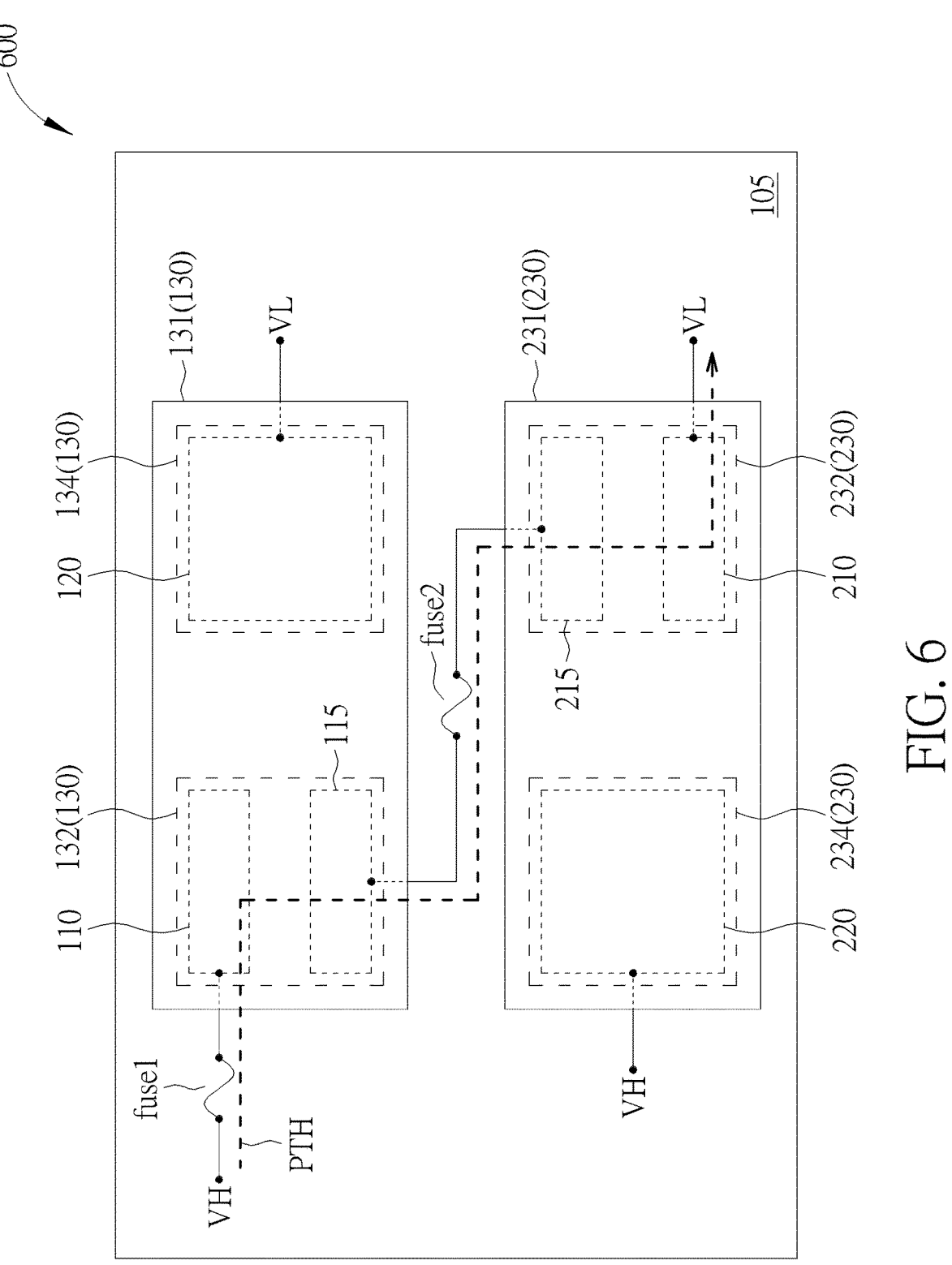
FIG. 6 illustrates a sectional view of an electronic device according to another embodiment.

According to another embodiment, if the electronic component 130 is detected to be improperly coupled, a spare electronic component 230 can be used. FIG. 6 illustrates an electronic device 600 according to another embodiment. Compare with the electronic device 100, the electronic device 600 can further include a third spare pad 210, a fourth spare pad 220, a third detection pad 215 and a spare electronic component 230. Like the electronic component 130, the spare electronic component 230 can include a light-emitting unit 231, a third electrode 232 and a fourth electrode 234. According to an embodiment, the third spare pad 210 can be separated from the third detection pad 215, the third electrode 232 can be coupled to the third spare pad 210 and the third detection pad 215, and the fourth electrode 234 can be coupled to the fourth spare pad 220.

According to an embodiment, as shown in FIG. 6, the electronic device 600 can further include a first fuse fuse1 and a second fuse fuse2. The first fuse fuse1 can be electrically connected to the first pad 110, and the second fuse fuse2 can be electrically connected to the first detection pad 115 and the third detection pad 215.

According to an embodiment, the current withstand capability of the first fuse fuse1 can be lower than that of the second fuse fuse2. If the electronic component 130 is checked to be improperly coupled, a high voltage VH can be applied to the first pad 110 to blow the first fuse fuse1, so that the electronic component 130 is not used, and the spare electronic component 230 can be driven and used instead.

If the first fuse fuse1 is not blown, the current can flow through the second fuse fuse2 along the path PTH to blow the second fuse fuse2 to cut off the path PTH. Hence, the short circuit between the high voltage VH and a low voltage VL is avoided, reducing the risk of damaging the electronic device 600 due to the short circuit.

According to an embodiment, as shown in FIG. 6, the second pad 120 and the third spare pad 210 can receive the low voltage VL.

According to an embodiment, when any of the first fuse fuse1 and the second fuse fuse2 is blown, the electronic component 130 is no longer in operation, and the spare electronic component 230 is driven and is in operation instead. According to an embodiment, any of the first fuse fuse1 and the second fuse fuse2 can include a plurality of fuses coupled in series. The path PTH is cutoff when any of the fuses coupled in series is blown.

Figure 7:
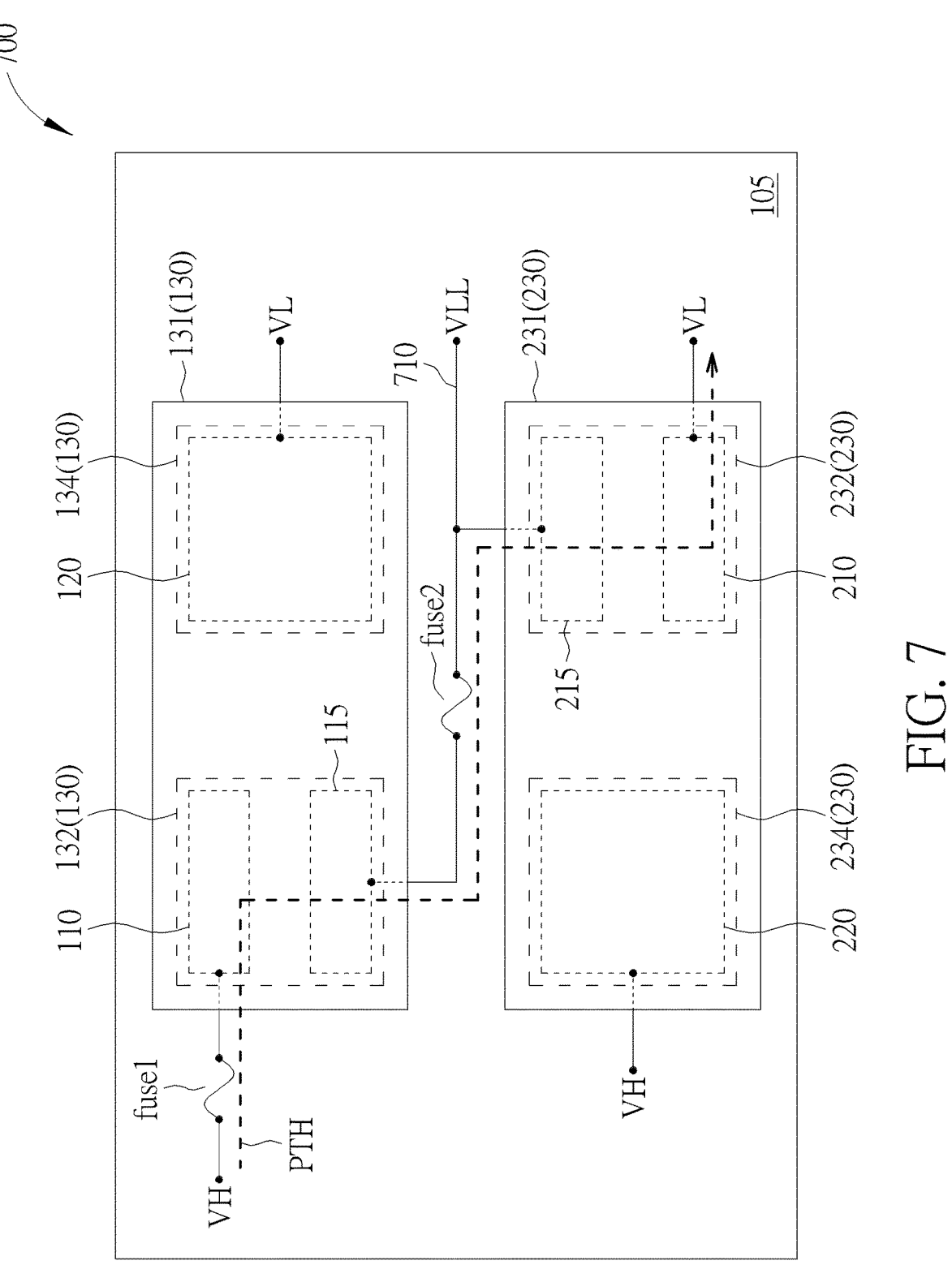
FIG. 7 illustrates an electronic device according to another embodiment.

FIG. 7 illustrates the electronic device 700 according to an embodiment. Compared with the electronic device 600, the electronic device 700 can further include a signal line 710 electrically connected to a node between the second fuse fuse2 and the third detection pad 215. The signal line 710 can be used to receive an external voltage VLL lower than the low voltage VL. Hence, a voltage difference between the first fuse fuse1 and the second fuse fuse2 can be increased to raise the chance of blowing the first fuse fuse1 and/or the second fuse fuse2.

According to an embodiment, as shown in FIG. 6 and FIG. 7, the electronic component 130 can be a master electronic component, and the spare electronic component 130 can be a slave electronic component. When the master electronic component is checked to be improperly coupled, the slave electronic component can be used instead to correct the error. Taking a display as an example, if the electronic component 130 is improperly coupled, the spare electronic component 130 can be used instead to emit light.

For example, in FIG. 6 and FIG. 7, the first electrode 132 and the second electrode 134 can be a P-electrode and an N-electrode of the electronic component 130 respectively. The third electrode 232 and the fourth electrode 234 can be a P-electrode and an N-electrode of the spare electronic component 230 respectively. However, embodiments are not limited thereto, and the configurations can be adjusted according to actual requirements.

Figure 8:
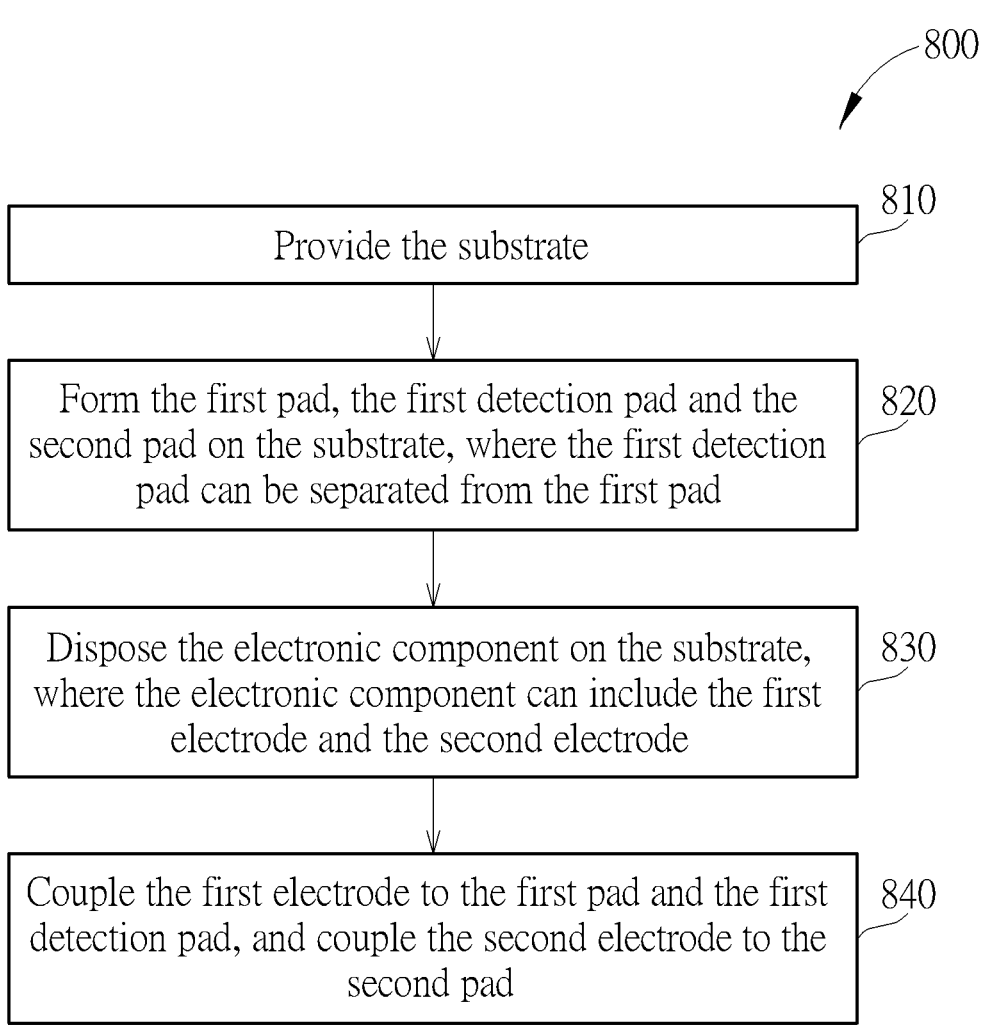
FIG. 8 illustrates a method for manufacturing an electronic device according to an embodiment.

FIG. 8 illustrates a method 800 for manufacturing an electronic device according to an embodiment. The method 800 can be performed to manufacture the electronic device 100, the electronic device 300 and the electronic device 500. As shown in FIG. 8, the method 800 can include the following steps.

Step 810: provide the substrate 105;

Step 820: form the first pad 110, the first detection pad 115 and the second pad 120 on the substrate 105, where the first detection pad 115 can be separated from the first pad 110;

Step 830: dispose the electronic component 130 on the substrate 105, where the electronic component 130 can include the first electrode 132 and the second electrode 134; and Step 840: couple the first electrode 132 to the first pad 110 and the first detection pad 115, and couple the second electrode 134 to the second pad 120.

FIG. 9 illustrates a method 900 for manufacturing an electronic device according to another embodiment. For example, the method 900 can be performed to manufacture the electronic device 600 and the electronic device 700. As shown in FIG. 9, the method 900 can include the following steps.

Step 810: provide the substrate 105;

Step 820: form the first pad 110, the first detection pad 115 and the second pad 120 on the substrate 105, where the first detection pad 115 can be separated from the first pad 110;

Step 825: form the third spare pad 210, the fourth spare pad 220, the third detection pad 215, the first fuse fuse1 and the second fuse fuse2 on the substrate 105, where the third spare pad 210 can be separated from the third detection pad 215, the first fuse fuse1 can be electrically connected to the first pad 110, and the second fuse fuse2 can be electrically connected to the first detection pad 115 and the third detection pad 215;

Step 830: dispose the electronic component 130 on the substrate 105, where the electronic component 130 can include the first electrode 132 and the second electrode 134;

Step 840: couple the first electrode 132 to the first pad 110 and the first detection pad 115, and couple the second electrode 134 to the second pad 120;

Step 860: check whether the electronic component 130 is properly coupled;

Step 870: if the electronic component 130 is improperly coupled, dispose the spare electronic component 230 on the substrate 105; and Step 880: couple the spare electronic component 230 to the third spare pad 210, the fourth spare pad 220 and the third detection pad 215.

In the method 900, if the electronic device includes the signal line 710 in FIG. 7 to receive the external voltage VLL, the external voltage VLL can be optionally provided to the node between the second fuse fuse2 and the third detection pad 215 to increase the voltage difference between the first fuse fuse1 and the second fuse fuse2 so as to increase the chance of blowing the first fuse fuse1 and/or the second fuse fuse2.

Figure 10:
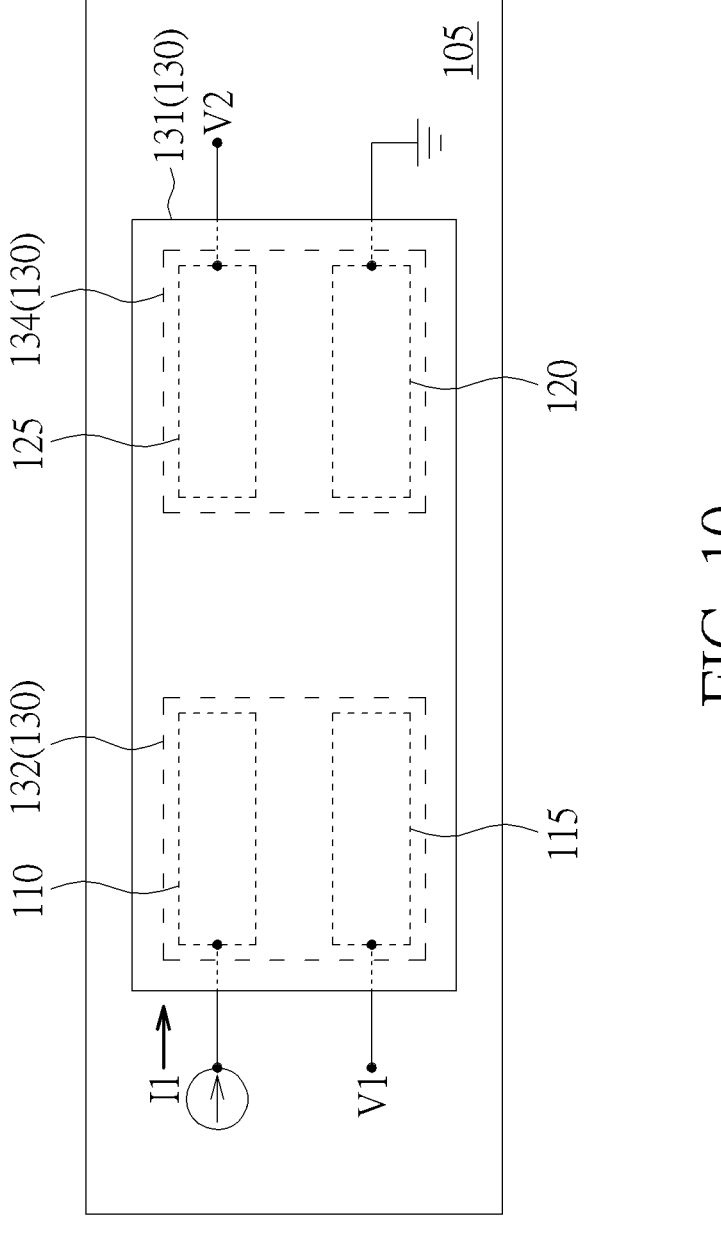
FIG. 10 illustrates that an electronic device is measured according to an embodiment.

FIG. 10 illustrates that an electronic device is measured according to an embodiment. For example, the electronic device in FIG. 10 can be the electronic device 300 in FIG. 3. In FIG. 10, a four-point probe can be used to perform the measurement. As shown in FIG. 10, a current I1 can be inputted into the first pad 110, and the second pad 120 can be coupled to a fixed voltage terminal (e.g. ground terminal). A voltage V1 can be measured on the first detection pad 115, and a voltage V2 can be measured on the second detection pad 125. Through the four-point probe, the electrical properties of the electronic device can be measured, and the interferences caused by wiring can be reduced. The measurement results can be used to calibrate characteristics of the electronic devices (such as light-emitting diode devices). For example, the measurement results can be fed back to a chip or a driving circuit for uniformity compensation. For example, the measurement results can be used for defect correction (a.k.a. demura).

In summary, by using the electronic devices and the manufacture methods provided by embodiments, the need for complex optical systems used for receiving light is reduced. According to an embodiment, detection pad(s) can be used to form a feedback circuit to check if an electronic device is properly coupled after the electronic device is installed. According to an embodiment, when a master electronic device is improperly coupled, a complete solution is provided to use a slave electronic device to correct the error. According to an embodiment, a complete measurement solution is provided for measuring and calibrating the electronic device. As a result, the complexities of the system and the related process are effectively reduced.

Those skilled in the art will readily observe that numerous modifications and alterations of the device and method may be made while retaining the teachings of the disclosure.

Accordingly, the above disclosure should be construed as limited only by the metes and bounds of the appended claims.

What is claimed is:

1. An electronic device comprising:
a substrate;
a first pad formed on the substrate;
a first detection pad formed on the substrate and separated from the first pad;
a second pad formed on the substrate; and
an electronic component comprising:
    a light-emitting unit;
    a first electrode coupled to the light-emitting unit; and
    a second electrode coupled to the light-emitting unit, wherein the first electrode is directly coupled to the first pad and the first detection pad, and the second electrode is coupled to the second pad.

2. The electronic device of claim 1, further comprising a second detection pad separated from the second pad, wherein the second electrode is further coupled to the second detection pad.

3. The electronic device of claim 1, further comprising a third spare pad, a fourth spare pad, a third detection pad, and a spare electronic component, wherein the spare electronic component comprises a third electrode and a fourth electrode, the third spare pad is separated from the third detection pad, the third electrode is coupled to the third spare pad and the third detection pad, and the fourth electrode is coupled to the fourth spare pad.

4. The electronic device of claim 3, further comprising a first fuse and a second fuse, wherein the first fuse is electrically connected to the first pad, and the second fuse is electrically connected to the first detection pad and the third detection pad.

5. The electronic device of claim 4, further comprising a signal line electrically connected to a node between the second fuse and the third detection pad.

6. A method for manufacturing an electronic device, comprising:
providing a substrate;
forming a first pad, a first detection pad and a second pad on the substrate, wherein the first detection pad is separated from the first pad;
disposing an electronic component on the substrate, wherein the electronic component comprises a light-emitting unit, a first electrode coupled to the light-emitting unit, and a second electrode coupled to the light-emitting unit;
coupling directly the first electrode to the first pad and the first detection pad; and
coupling the second electrode to the second pad.

7. The method of claim 6, further comprising:
forming a third spare pad, a fourth spare pad, a third detection pad, a first fuse and a second fuse on the substrate, wherein the third spare pad is separated from the third detection pad, the first fuse is electrically connected to the first pad, and the second fuse is electrically connected to the first detection pad and the third detection pad;
checking whether the electronic component is properly coupled;
if the electronic component is improperly coupled, disposing a spare electronic component on the substrate; and
coupling the spare electronic component to the third spare pad, the fourth spare pad and the third detection pad.

8. The method of claim 7, further comprising providing an external voltage to a node between the second fuse and the third detection pad.

* * * * *